United States Patent [19]

Basol

[11] 4,456,630
[45] Jun. 26, 1984

[54] METHOD OF FORMING OHMIC CONTACTS

[75] Inventor: Bulent M. Basol, Los Angeles, Calif.

[73] Assignee: Monosolar, Inc., Inglewood, Calif.

[21] Appl. No.: 524,411

[22] Filed: Aug. 18, 1983

[51] Int. Cl.³ .......................... B05D 5/12; B44C 1/22; C03C 15/00; C03C 25/06

[52] U.S. Cl. ........................................ 427/88; 29/572; 156/651; 156/655; 252/79.2; 252/79.3; 252/79.5; 357/65; 427/74; 427/309

[58] Field of Search .............. 156/650, 651, 655, 662; 427/88–90, 91–92, 74, 309; 357/16, 17, 19, 29, 30, 65; 29/572; 136/256, 260, 264; 252/79.2, 79.3, 79.5

[56] References Cited

U.S. PATENT DOCUMENTS 2,822,250  2/1958  DeNobel ..................... 156/651 X
2,822,299  2/1958  DeNobel ..................... 156/625 X Primary Examiner—William A. Powell
Attorney, Agent, or Firm—Freilich, Hornbaker, Rosen & Fernandez

[57] ABSTRACT

A method of forming ohmic contacts with thin film p-type semiconductor Class II B - VI A compounds comprising etching the film surface with an acidic solution, then etching with a strong basic solution and finally depositing a conductive metal layer.

8 Claims, 3 Drawing Figures

METHOD OF FORMING OHMIC CONTACTS

BACKGROUND OF THE INVENTION

This invention relates to thin film heterojunction photovoltaic cells and methods of forming ohmic contacts with a thin film of a p-type semiconductor compound formed of at least one of the metal elements of Class II B of the Periodic Table of Elements and one of the non-metal elements of Class VI A of the Periodic Table of Elements.

The difficulty of making good ohmic contacts to p-type Class II B - VI A compounds such as cadmium telluride is well known. These materials on the other hand are very important for photovoltaic applications. As a consequence the utilization of such compounds for thin film solar cell applications largely depend on the ability to make low resistance ohmic contacts on them. Consequently, the following procedure has been widely accepted for use in making ohmic contacts to p-CdTe:

(a) etching the p-CdTe with an acidic solution and then (b) depositing by vacuum evaporation or electroless plating a suitable metal such as platinum, gold, nickel, or copper. The acidic etches commonly used in the first step are:

$H_2SO_4 + K_2Cr_2O_7 + H_2O$; $HNO_3 + K_2Cr_2O_7 + H_2O$; $HNO_3 + K_2Cr_2O_7 + AgNO_3 + H_2O$; $HF + H_2O_2 + H_2O$; $HF + HNO_3 + H_2O$; $HNO_3 + H_2O$ and bromine methanol. The belief is that the acidic etch leaves a tellurium rich surface which improves the contact between the metal to be deposited and the p-CdTe. Such acidic etchings have been normally used in connection with low resistivity single crystal CdTe and contact deposition is sometimes followed by a 5-15 minute heat treatment (150° C.) in $H_2$ atmosphere to improve the contact. A recent study concludes that the best ohmic contact to single crystal low resistivity p-CdTe can be obtained by an etch ($K_2Cr_2O_7 + H_2SO_4 + H_2O$) followed by (Au+Cu) alloy evaporation.

In the case of thin film (thickness less than 10 micrometers) devices one works with a relatively high resistivity material (resistivity greater than 100 ohm-centimeters) which makes the contact problem ever more serious. Strong acidic etches used for single crystal CdTe are not normally used for thin films with the exception of very dilute (approximately 0.1%) bromine methanol. Among various techniques reported are direct application of the contact material on the fresh CdTe surface without any etching and formation of a $Cu_xTe$ layer on the surface by evaporation or by chemical methods. But by far the most common technique is contact deposition after a mild bromine methanol etch. Unfortunately, the use of the $Cu_xTe$ layer has a tendency to be unstable and the direct application of the contact metal as well as a simple bromine methanol etch does not give as good an ohmic contact as is generally desired.

Consequently, an object of the present invention is an improved method of forming ohmic contacts between a Class II B - VI A compound and a conductive metal layer. In particular, an object of the present invention is to form such ohmic contact with p-type cadmium telluride.

SUMMARY OF THE INVENTION

In general, the present invention involves the etching of a thin film of a p-type Class II B - VI A compound particularly CdTe with an acidic solution, preferably an oxidizing acidic solution, then treating the surface of said film with a strong basic solution and finally depositing on said surface a conductive metal layer.

In order to facilitate understanding of the present invention, reference will now be made to the drawings and to a preferred specific embodiment of the present invention and specific examples thereof. Such examples, like the preceding summary, should not be construed as limiting the present invention which is properly set forth in the appended claims.

DESCRIPTION OF THE PREFERRED EMBODIMENT OF THE PRESENT INVENTION

Figure 1:
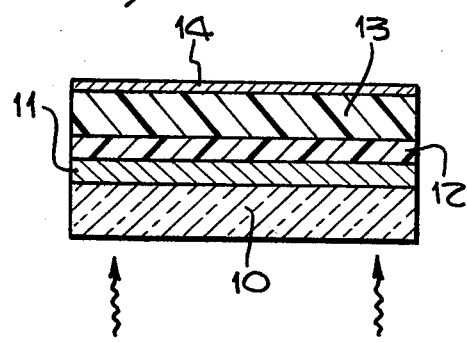
FIG. 1 is a cross sectional view of a schematic drawing of the preferred embodiment of a photovoltaic cell constructed in accordance with the present invention.

As shown in FIG. 1, the preferred embodiment of the present invention includes a first sheet 10 of insulating transparent material such as glass. On sheet 10 is a layer 11 of a conductive transparent material such as indium tin oxide. On layer 11 is deposited a layer 12 of semiconductor material such as cadmium sulfide which is different from the film semiconductor compound described below. The combination of layers 11 and 12 comprise an n-type wide band window semiconductor substrate different from the film 13 semiconductor compound described below. On layer 12 is deposited a film 13 of a semiconductor compound formed of at least one of the metal elements of Class II B of the Periodic Table of Elements and one of the non-metal elements of Class VI A of the Periodic Table of Elements. On the surface of film 13 is deposited a layer of 14 of a conductive metal such as gold. The purpose of the present invention is to have layer 14 form a good ohmic contact with film 13. On the surface of layer 14, a suitable grid pattern may be deposited, if necessary.

Figure 2:
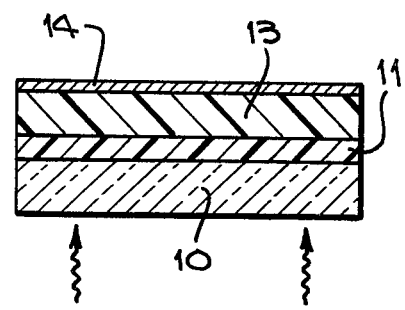
FIG. 2 is a cross sectional view of another schematic embodiment of a photovoltaic cell constructed in accordance with the present invention.

The embodiment of the present invention shown in FIG. 2 is identical to the embodiment of the present invention and the method of practicing the same can best be described by reference to a specific semiconductor device whose method of construction shall now be described. The method of making the photovoltaic device illustrated in FIG. 1 has been described in detail in the commonly assigned United States patent of Bulent M. Basol, Eric S. Tseng, and Robert L. Rod entitled "Thin Film Heterojunction Photovoltaic Cells and Methods of Making the Same" U.S. Pat. No. 4,388,483 issued June 14, 1983. After the electrodeposition of the cadmium telluride film 13 and its heat treatment as described in the above identified patent which forms a p-type cadmium telluride film, a first segment of such film was etched for about two seconds with a solution of one part by volume 98% by weight $H_2SO_4$ and one part by volume saturated $K_2Cr_2O_7$ solution and then rinsed with the deionized water and dried by blowing with nitrogen gas. The cell was then immersed in hot hydrazine (65° C.) 1 minute and then rinsed with deionized water and blow dried with nitrogen. Next the layer 14 of gold was evaporated onto the surface of the film 13 and the resulting photovoltaic cell was measured with the results being displayed as curve a on FIG. 3 which has a fill factor of approximately 0.55 and an overall efficiency of 7.4%.

As a comparison with the method of the present invention a second segment of the p-type cadmium telluride film was etched with a one part by volume 98% by weight $H_2SO_4$ solution and one part by volume saturated $K_2Cr_2O_7$ solution for about two seconds and then rinsed with deionized water and blow dried with nitrogen. Then the layer 14 of gold was deposited by evaporation. As discussed before this prior art has heretofore been considered to be the best technique to make good contacts to low resistivity single crystal p-CdTe.

Figure 3:
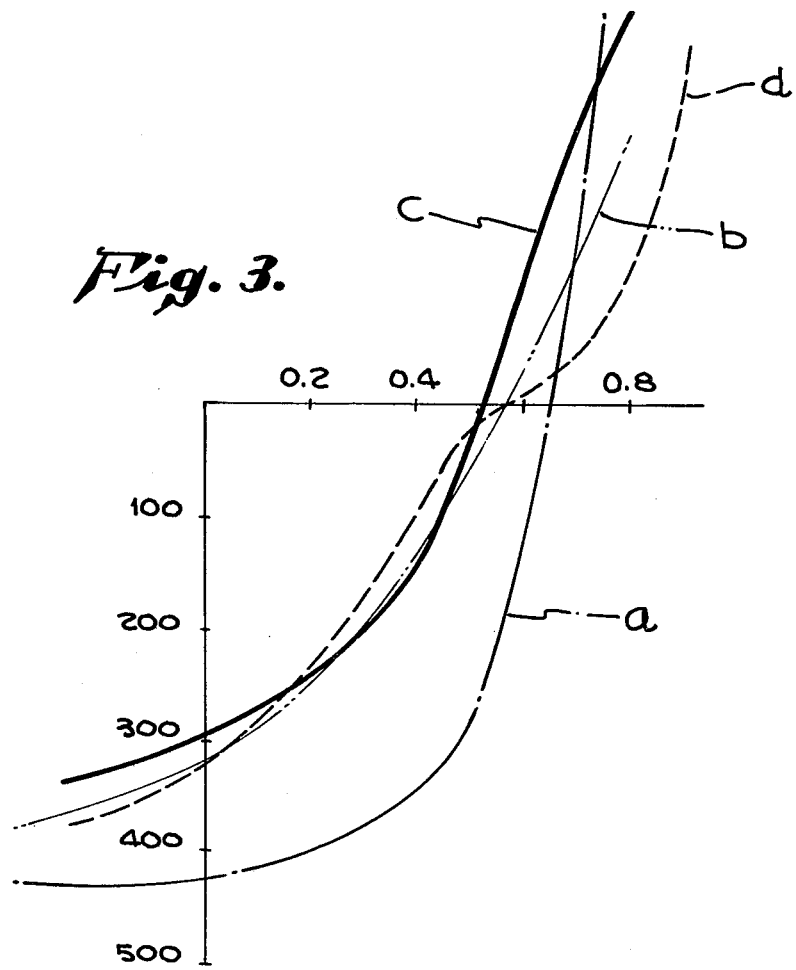
FIG. 3 is a graph of the voltage-current characteristics of a variety of cells prepared using prior methods and the method of the present invention.

The resulting photovoltaic cell performance is shown as curve b on FIG. 3 where the $V_{oc}$ and the $I_{sc}$ are both decreased and the shape of the curve results in a fill factor of around 0.32 with the resulting overall efficiency of 2.9%. Such data indicates that with the prior-art technique there is a high series resistance between layer 14 and film 13, as compared with the present technique. Another comparison was conducted with a third segment of the p-type cadmium telluride film where the surface of the p-type cadmium telluride film was etched for about three seconds in a 0.1% bromine methanol solution and then rinsed with methanol and blow dried with nitrogen gas. The layer 14 of gold was then deposited by evaporation. As discussed above, such procedure is a known common procedure for high resistance polycrystalline thin films of p-type cadmium telluride and the resulting performance of such a photovoltaic cell is shown as curve c in FIG. 3. Again, both the $V_{oc}$ and $I_{sc}$ are lower compared to curve a and the resulting fill factor is approximately 0.4 with an overall efficiency of about 3%. The shape of curve c indicates that there is a substantial resistance at the interface of film 13 and layer 14. Also decreasing slope of the I-V at high I values indicate the presence of an undesirable barrier at the Au/p-CdTe interface. Finally, a fourth segment of the p-type cadmium telluride film was treated in the same manner as the third segment except that prior to the deposition of the layer 14 it was immersed in hot hydrazine for 1 minute and then rinsed with deionized water and blow dried with nitrogen. Then a layer 14 of gold was evaporated onto the film 13. The resulting photovoltaic device is shown as curve d in FIG. 3 and has a fill factor of 0.26 and an overall efficiency of about 2.5%. The shape of this curve shows a very strong barrier at the Au/CdTe interface.

The results of the measurements on the samples illustrated in FIG. 3 are tabulated in Table 1. As shown in Table 1 the improvement obtained by the method of the present invention eliminates the excessive series resistance as well as the undesirable barrier at the Au/CdTe interface and results in the efficiency of the device being more than doubled.

TABLE 1

| Device | Etching Procedure | Efficency (percent) |
|---|---|---|
| 1 | Dichromate etch followed by hydrazine etch | 7.4 |
| 2 | Dichromate etch | 2.9 |
| 3 | Bromine methanol etch | 3.0 |
| 4 | Bromine methanol etch followed by treatment etch | 2.5 |

A variety of materials may be used in each of the steps of the method of the present invention. With respect to the etching of the surface of the film with an acidic solution to form a non-metal-rich surface, the etching agent may by any strong acid + oxidizing agent such as a dicromate or a peroxide compound. Similarly, the acid may be any strong acid such as sulfuric, nitrate, hydrochloric or hydrofloric acid. With respect to the basic solution used for the second "etch", it may be any strong base such as hydrazine or an alkaline metal hydroxide solution such as potassium hydroxide or sodium hydroxide. The term "etch" is here put between quotations marks because it does not involve a measureable removal of material from the surface but instead treats the acid etched surface to render it more tellurium rich for a better ohmic contact with metal, such as gold. The metals which may be used to form the conductive layer may include platinum, gold, silver, copper, or alloys of one or more of such metals.

With respect to the etching treating steps themselves, the etching time must be adjusted depending on the concentration of the oxidizing compound so that only a thin surface layer (approximately 100 to 1000 Angstroms thick) is etched away. In addition, it is important that the acidic etch be of a type to form a non-metal-rich surface such as a tellurium rich surface. Consequently, an etch such as a bromine methanol etch does not accomplish such desired result since it leaves a relatively stoichiometric surface.

With respect to the treatment with the basic solution, the timing depends on the temperature of the solution. While the desired results are obtained in 1-5 minutes in a solution at 65° C., a minimum of 5 minutes is desirable if a solution at room temperature as used. But any longer time than the minimum required is not necessarily beneficial. Tables 2 and 3 gives the solar cell parameters for 2 sets of devices made on 2 different substrates in accordance with the present invention as a function of treating times in basic solution.

TABLE 2

| Device No. | Basic etch | Efficency (percent) |
|---|---|---|
| A | 30 min at 25°C. | 5.59 |
| B | 15 min at 25°C | 5.61 |
| C | 5 min at 70°C | 5.56 |

TABLE 3

| Device No. | Basic etch | Efficency percent) |
|---|---|---|
| D | 15 min at 25°C. | 3.1 |
| E | 45 min at 25°C | 3.1 |
| F | 30 min at 25°C | 3.9 |

The efficiencies measured are not affected by the treating time for the times considered. Apparently treating on the range from about 10 to 45 minutes at room temperature gives a suitable result which not only nullifies the undersirable effect of the oxides from the surface but also treats the surface in a manner to give the resulting good ohmic contact with the metal layer subsequently deposited.

There are many features in the present invention which clearly show the significant advantage which the present invention achieves over the prior art. Consequently, only a few of the more outstanding features will be pointed out to illustrate the unexpected and unusual results obtained by the present invention. One feature is that as illustrated in FIG. 3, the conventional surface treatments for single crystal p-type cadmium telluride and for polycrystalline p-type cadmium telluride both result in a substantial resistance being produced between the metal layer and the cadmium telluride layer. Thus it is necessary that the second treating step be used to achieve results of the present invention. Another feature of the present invention is that although a polycrystalline surface is involved, the use of the conventional etching bromine methanol does not yield the desired result even when combined with a subsequent basic treatment. Consequently, it is the unique combination of the acid etching and basic treatment which yield the desired result.

It will be understood that the foregoing description is only an illustrative of the present invention and is not intended that the invention be limited thereto. All substitutions, alterations, and modifications of the present invention is rarely susceptible without departing from the spirit and scope of the disclosure are considered part of the present invention.

What is claimed is:

1. A method of forming ohmic contacts with thin film of a p-type semiconductor compound formed of at least one of the metal elements of Class II B of the Periodic Table of Elements and one of the non-metal elements of Class VI A of the Periodic Table of Elements comprising:

(a) etching the surface of said film with an acidic solution to form a non-metal-rich surface;
    (b) treating the surface of the acid etched film with a strong basic solution; and
    (c) then depositing on said etched and treated surface a conductive metal layer.

2. A method as stated in claim 1 wherein the acidic solution is an oxidizing acidic solution.

3. A method as stated in claim 2 wherein the oxidizing acidic solution includes as an oxidizing agent, a dichromate or a peroxide compound.

4. A method as stated in claim 2 wherein the oxidizing acidic solution includes as an acid, sulfuric, nitric, hydrochloric or hydrofloric acid.

5. A method as stated in claim 1 wherein the strong basic solution comprises hydrazine or alkali metal hydroxide solution.

6. A method as stated in claim 1 wherein the conductive metal includes platinum, gold, silver, copper or alloys of one or more of said metals.

7. A method as stated in claim 1 wherein the acidic solution is a dichromate and the basic solution is a hydrazine 8. A method as stated in claim 7 wherein the dichromate is comprised of one part by volume $H_2SO_4$ and one part by volume saturated $K_2Cr_2O_7$.

* * * * *